United States Patent
Hwang

(10) Patent No.: US 7,622,924 B2
(45) Date of Patent: Nov. 24, 2009

(54) METHOD AND APPARATUS FOR K-SPACE AND HYBRID-SPACE BASED IMAGE RECONSTRUCTION FOR PARALLEL IMAGING AND ARTIFACT CORRECTION

(75) Inventor: Ken-Pin Hwang, Sugar Land, TX (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 12/211,145

(22) Filed: Sep. 16, 2008

(65) Prior Publication Data

US 2009/0001984 A1  Jan. 1, 2009

Related U.S. Application Data

(63) Continuation-in-part of application No. 11/761,732, filed on Jun. 12, 2007.

(51) Int. Cl.
*G01V 3/00* (2006.01)
(52) U.S. Cl. .................. 324/309; 324/307
(58) Field of Classification Search ......... 324/300–322; 600/407–445; 382/131
See application file for complete search history.

(56) References Cited

U.S. PATENT DOCUMENTS

| | | | | |
|---|---|---|---|---|
| 7,180,290 | B2 * | 2/2007 | Van Den Brink | 324/309 |
| 7,394,252 | B1 * | 7/2008 | Lin | 324/309 |
| 7,397,242 | B2 * | 7/2008 | Samsonov et al. | 324/309 |
| 7,408,345 | B2 * | 8/2008 | Bammer et al. | 324/307 |
| 2008/0197842 | A1 * | 8/2008 | Lustig et al. | 324/307 |

OTHER PUBLICATIONS

Liu et al., "Simultaneous Phase Correction and SENSE Reconstruction for Navigated Multi-Shot DWI with Non-Cartesian k-Space Sampling," Magnetic Resonance in Medicine, 2005, vol. 54, pp. 1412-1422.

Miller et al., "Nonlinear Phase Correction for Navigated Diffusion Imaging," Magnetic Resonance in Medicine, 2003, vol. 50, pp. 343-353.

Atkinson et al., "Multiple Coils for Regridding Multi-Shot EPI Diffusion Data," Proc. Intl. Soc. Mag. Reson. Med., 2005, vol. 13, p. 1307.

Atkinson et al., "Sampling and Reconstruction Effects Due to Motion in Diffusion-Weighted Interleaved Echo Planar Imaging," Magnetic Resonance in Medicine, 2000, vol. 44, pp. 101-109.

Porter, "2D-Navigator-Based Re-Acquisition for Motion Artefact Suppression in Multi-Shot, Diffusion-Weighted Imaging," Proc. Intl. Soc. Mag. Reson. Med., 2006, vol. 14, p. 1047.

* cited by examiner

*Primary Examiner*—Brij B Shrivastav
(74) *Attorney, Agent, or Firm*—Ziolkowski Patent Solutions Group, SC

(57) ABSTRACT

A method for performing correction in an autocalibrated, multi-shot MR imaging data acquisition includes performing correction on k-space data in an autocalibration region for each shot individually and then combining the corrected k-space data from each shot to form a corrected reference autocalibration region. Uncorrected source k-space data points are "trained to" the corrected k-space data from the corrected reference autocalibration region to determine coefficients that are used to synthesize corrected k-space data in the outer, undersampled regions of k-space. Similarly, acquired k-space lines in the outer, undersampled regions of k-space may also be replaced by corrected synthesized k-space data. The corrected k-space data from the corrected reference autocalibration region may be combined with the synthesized corrected k-space data for the outer, undersampled regions of k-space to reconstruct corrected images corresponding to each coil element. The corrected images corresponding to each coil element may be combined into a resultant image.

20 Claims, 5 Drawing Sheets

METHOD AND APPARATUS FOR K-SPACE AND HYBRID-SPACE BASED IMAGE RECONSTRUCTION FOR PARALLEL IMAGING AND ARTIFACT CORRECTION

CROSS-REFERENCE TO RELATED APPLICATION

The present application is a continuation-in-part of and claims priority of U.S. patent application Ser. No. 11/761,732 filed Jun. 12, 2007.

BACKGROUND OF THE INVENTION

The present invention relates generally to magnetic resonance imaging (MRI) systems and in particular, to a method for performing correction for multi-shot MRI acquisitions that are combined with auto-calibrated parallel imaging techniques.

Magnetic resonance imaging (MRI) is a medical imaging modality that can create images of the inside of a human body without using x-rays or other ionizing radiation. MRI uses a powerful magnet to create a strong, uniform, static magnetic field (i.e., the "main magnetic field"). When a human body, or part of a human body, is placed in the main magnetic field, the nuclear spins that are associated with the hydrogen nuclei in tissue water become polarized. This means that the magnetic moments that are associated with these spins become preferentially aligned along the direction of the main magnetic field, resulting in a small net tissue magnetization along that axis (the "z axis", by convention). A MRI system also comprises components called gradient coils that produce smaller amplitude, spatially varying magnetic fields when current is applied to them. Typically, gradient coils are designed to produce a magnetic field component that is aligned along the z axis (i.e., the "longitudinal axis"), and that varies linearly in amplitude with position along one of the x, y or z axes. The effect of a gradient coil is to create a small ramp on the magnetic field strength, and concomitantly on the resonance frequency of the nuclear spins, along a single axis. Three gradient coils with orthogonal axes are used to "spatially encode" the MR signal by creating a signature resonance frequency at each location in the body. Radio frequency (RF) coils are used to create pulses of RF energy at or near the resonance frequency of the hydrogen nuclei. These coils are used to add energy to the nuclear spin system in a controlled fashion. As the nuclear spins then relax back to their rest energy state, they give up energy in the form of an RF signal. This signal is detected by the MRI system and is transformed into an image using a computer and known reconstruction algorithms.

In certain clinical imaging applications, it is desirable to acquire "diffusion-weighted" images in which tissues that have either higher or lower water self-diffusion characteristics relative to other tissues are emphasized. Typically, diffusion-weighting is implemented using a pair of large gradient pulses bracketing a refocusing RF pulse. Because spins undergoing irregular motion due to diffusion are not completely re-phased by the second gradient pulse of the pair, signal from these spins is attenuated such that tissues with higher water diffusion experience increased signal loss.

Most clinical diffusion-weighted imaging is performed using single-shot sequences, such as single-shot echo-planar imaging (EPI). However, single-shot acquisitions typically have limited resolution and are sensitive to susceptibility-induced image distortions and eddy-current effects. For multi-shot acquisitions, non-diffusive bulk motions can cause shot-specific phase shifts that can destructively interfere when the multiple shots are combined, resulting in serious image artifacts. To reduce image artifacts, these phase shifts may be corrected for each shot individually before combining shots into a final image. Multiple approaches to performing such a motion correction for multi-shot acquisitions are known in the art.

Alternatively, steady-state free precession (SSFP) imaging has recently gained popularity in the magnetic resonance imaging field. SSFP sequences have a high signal-to-time efficiency, and thus provide a high signal and good contrast in a relatively short scan time. Unlike diffusion-weighted images, which vary in phase, raw images acquired by SSFP sequences vary in both magnitude and phase. Such magnitude and phase variance results in phase and magnitude errors, which in turn result in bands of signal loss, or "banding artifacts". These banding artifacts may be reduced using various known multiple acquisition techniques, wherein multiple sets of images are acquired, each with a different RF phase increment. When combined, these sets of images produce a single, artifact-free image. However, these techniques also increase scan time, as multiple fully-sampled images are acquired and then combined.

"Parallel imaging" techniques may be combined with multi-shot acquisitions, in which k-space is "under-sampled" (i.e., the Nyquist criteria is not met) and the signals from multiple receiver coils are combined to provide aliasing-free images. Parallel imaging techniques (also known as "partially parallel imaging" techniques) use the spatial sensitivity profiles of the individual receiver coils in addition to traditional gradient encoding to localize the received MRI signals to individual voxels from a source volume of interest. Parallel imaging has been proven successful in reducing scan time for many applications and has also found application in reducing image blurring and geometric distortions in pulse sequences that use long echo trains.

Two families of parallel imaging techniques are known in the art for generating images from incompletely sampled data, based either on the SENSE technique (SENSitivity Encoding), or on the SMASH technique (SiMultaneous Acquisition of Spatial Harmonics). The SENSE-based techniques separately transform the undersampled individual receiver coil k-space data sets into image-space, resulting in spatially aliased images. The aliased images are then combined using weights constructed from measured spatial sensitivity profiles from the individual receiver coils to give a final image with the aliasing artifacts removed.

The first SMASH-based techniques that were developed used designed spatial sensitivity profiles of dedicated imaging array coils. These spatial sensitivity designs were used to emulate mathematical relationships between data located at neighboring k-space lines in order to synthesize unacquired k-space lines from acquired lines. More recently, autocalibrated imaging (ACI) techniques based on SMASH such as AUTO-SMASH, VD-AUTO-SMASH, ARC, and GRAPPA, have been developed that do not require strict design of receiver coil arrays. Instead, a small region in k-space is acquired with full Nyquist sampling as part of an overall undersampled acquisition. The fully sampled region in k-space is used to determine coefficients that may be used to synthesize unacquired data in k-space from the acquired data. The extra data obtained in the fully sampled region are referred to as "autocalibration data," and the region of k-space that is fully sampled is the "autocalibration region".

Techniques are known for correcting motion-induced phase shifts in multi-shot diffusion-weighted acquisitions combined with SENSE-based parallel imaging. Another SENSE-based correction technique, known as super-FOV (sFOV), combines images from multiple Steady-State Free Precession acquisitions at varying phase increments to reconstruct a relatively artifact-free image, while still reducing overall scan time. However, these techniques are not compatible with multi-shot acquisitions that are combined with autocalibrated SMASH-based parallel imaging reconstruction algorithms. Accordingly, it would be desirable to provide a method for correcting shot-specific phase shifts from non-diffusive bulk motion in autocalibrated, multi-shot diffusion-weighted data. Similarly, it would also be desirable to provide a method for correcting shot-specific phase and magnitude errors in autocalibrated, multi-shot SSFP sequence images.

BRIEF DESCRIPTION OF THE INVENTION

In accordance with an embodiment, a method for correcting phase and/or magnitude errors in a multiple shot magnetic resonance imaging (MRI) data acquisition includes acquiring MRI data using a plurality of shots, each shot acquiring uncorrected k-space data comprising an autocalibration region and at least one undersampled outer region, generating corrected k-space data corresponding to the autocalibration region of each shot, generating a corrected reference autocalibration region using at least a portion of the corrected k-space data, calculating at least one set of coefficients based on a plurality of data points from the uncorrected k-space data and at least one data point from the corrected reference autocalibration region and synthesizing corrected k-space data using the at least one set of coefficients.

In accordance with another embodiment, a computer-readable medium having computer-executable instructions for performing a method for correcting phase and/or magnitude errors in a multiple shot magnetic resonance imaging (MRI) data acquisition includes program code for acquiring MRI data using a plurality of shots, each shot acquiring uncorrected k-space data comprising an autocalibration region and at least one undersampled outer region, program code for generating corrected k-space data corresponding to the autocalibration region of each shot, program code for generating a corrected reference autocalibration region using at least a portion of the corrected k-space data, program code for calculating at least one set of coefficients based on a plurality of data points from the uncorrected k-space data and at least one data point from the corrected reference autocalibration region and program code for synthesizing corrected k-space data by using the at least one set of coefficients.

In accordance with another embodiment, an apparatus for generating a magnetic resonance image includes a magnetic resonance imaging assembly including a magnet, a plurality of gradient coils, an array of radio frequency (RF) receiver coil elements, a radio frequency transceiver system, and a pulse generator module, and a computer system coupled to the magnetic resonance imaging assembly and programmed to acquire MRI data using a plurality of shots, each shot acquiring uncorrected k-space data comprising an autocalibration region and at least one undersampled outer region, generate corrected k-space data corresponding to the autocalibration region of each shot, generate a corrected reference autocalibration region using at least a portion of the corrected k-space data, calculate at least one set of coefficients based on a plurality of data points from the uncorrected k-space data and at least one data point from the corrected reference autocalibration region and synthesize corrected k-space data using the at least one set of coefficients.

BRIEF DESCRIPTION OF THE DRAWINGS

Embodiments are illustrated by way of example and not limitation in the figures of the accompanying drawings, in which like reference numerals indicate corresponding, analogous or similar elements, and in which.

DETAILED DESCRIPTION OF THE PREFERRED EMBODIMENT

In the following detailed description, numerous specific details are set forth in order to provide a thorough understanding of embodiments. However it will be understood by those of ordinary skill in the art that the embodiments may be practiced without these specific details. In other instances, well-known methods, procedures, components and circuits have not been described in detail so as not to obscure the embodiments.

A correction method for correcting phase errors and/or magnitude errors may be applied to a multi-shot acquisition that is combined with autocalibrated parallel imaging (API) techniques. Each shot includes an autocalibration region with fully sampled k-space data. Correction methods known in the art may be applied to the k-space data in the autocalibration region for each individual shot to generate corrected k-space data. The corrected k-space data from one or more of these shots is used to create a corrected reference autocalibration region. Outside the autocalibration region, shot-combined k-space is undersampled according to a conventional parallel imaging reduction factor, R. In a "training phase," sets of coefficients are determined that are used to combine acquired k-space data to yield unacquired k-space data. In a "synthesis phase," the sets of coefficients are used to synthesize unacquired k-space data. In the training phase, source k-space data points from the uncorrected k-space data in the autocalibration regions corresponding to each shot are "trained to" a target k-space data point from the corrected reference autocalibration region to generate correcting coefficients. The correcting coefficients are used to synthesize corrected unacquired k-space data from the uncorrected acquired k-space data. In addition, coefficients are also generated that are used to synthesize new corrected k-space data to replace uncorrected acquired k-space lines outside the autocalibration region. The synthesized corrected k-space data outside the autocalibration region are combined with corrected k-space data from the corrected autocalibration region to generate a full set of corrected k-space data for each coil element. Corrected images are generated for each coil element and are then combined to form a corrected resultant image.

Figure 1:
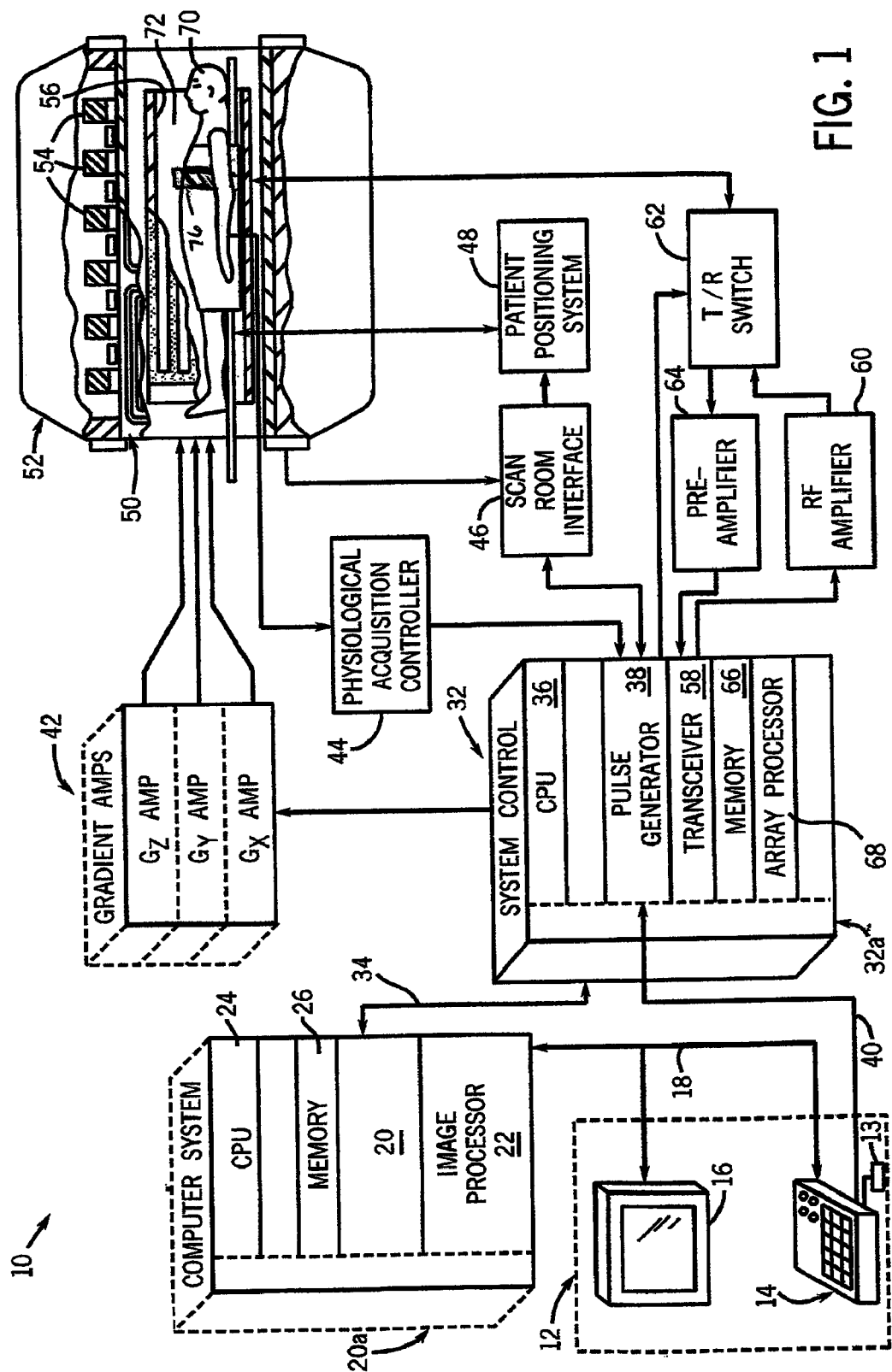
FIG. 1 is a schematic block diagram of an exemplary magnetic resonance imaging system in accordance with an embodiment.

FIG. 1 is a schematic block diagram of an exemplary magnetic resonance imaging system in accordance with an embodiment. The operation of MRI system 10 is controlled from an operator console 12 that includes a keyboard or other input device 13, a control panel 14, and a display 16. The console 12 communicates through a link 18 with a computer system 20 and provides an interface for an operator to prescribe MRI scans, display the resultant images, perform image processing on the images, and archive data and images. The computer system 20 includes a number of modules that communicate with each other through electrical and/or data connections, for example such as are provided by using a backplane 20a. Data connections may be direct wired links, or may be fiber optic connections or wireless communication links or the like. The modules of computer system 20 may include an image processor module 22, a CPU module 24 and a memory module 26 which may include a frame buffer for storing image data arrays. In an alternative embodiment, the image processor module 22 may be replaced by image processing functionality on the CPU module 24. The computer system 20 may also be connected to archival media devices, permanent or back-up memory storage or a network. Computer system 20 may also communicate with a separate system control computer 32 through a link 34. The input device 13 can include a mouse, joystick, keyboard, track ball, touch activated screen, light wand, voice control, or any similar or equivalent input device, and may be used for interactive geometry prescription.

The system control computer 32 includes a set of modules in communication with each other via electrical and/or data connections 32a. Data connections 32a may be direct wired links, or may be fiber optic connections or wireless communication links or the like. In alternative embodiments, the modules of computer system 20 and system control computer 32 may be implemented on the same computer systems or a plurality of computer systems. The modules of system control computer 32 include a CPU module 36 and a pulse generator module 38 that connects to the operator console 12 through a communications link 40. The pulse generator module 38 may alternatively be integrated into the scanner equipment (e.g., magnet assembly 52). It is through link 40 that the system control computer 32 receives commands from the operator to indicate the scan sequence that is to be performed. The pulse generator module 38 operates the system components that play out (i.e., perform) the desired pulse sequence by sending instructions, commands and/or requests (e.g., radio frequency (RF) waveforms) describing the timing, strength and shape of the RF pulses and pulse sequences to be produced and the timing and length of the data acquisition window. The pulse generator module 38 connects to a gradient amplifier system 42 and produces data called gradient waveforms which control the timing and shape of the gradient pulses that are to be used during the scan. The system control 32 may receive patient data from a physiological acquisition controller 44 that receives signals from a number of different sensors connected to the patient, such as ECG signals from electrodes attached to the patient. The pulse generator module 38 connects to a scan room interface circuit 46 that receives signals from various sensors associated with the condition of the patient and the magnet system. It is also through the scan room interface circuit 46 that a patient positioning system 48 receives commands to move the patient table to the desired position for the scan.

The gradient waveforms produced by the pulse generator module 38 are applied to gradient amplifier system 42 which is comprised of Gx, Gy and Gz amplifiers. Each gradient amplifier excites a corresponding physical gradient coil in a gradient coil assembly generally designated 50 to produce the magnetic field gradient pulses used for spatially encoding acquired signals. The gradient coil assembly 50 forms part of a magnet assembly 52 that includes a polarizing magnet 54 and may include a whole-body RF coil 56, surface or parallel imaging coils 76 or both. The coils 56, 76 of the RF coil assembly may be configured for both transmitting and receiving or for transmit-only or receive-only. A patient or imaging subject 70 may be positioned within a cylindrical imaging volume 72 of the magnet assembly 52. A transceiver module 58 in the system control computer 32 produces pulses that are amplified by an RF amplifier 60 and coupled to the RF coils 56, 76 by a transmit/receive switch 62. RF coil 56 may be replaced or augmented with surface and/or parallel transmit coils such as coil 76. The resulting signals emitted by the excited nuclei in the patient may be sensed by the same RF coil 56 and coupled through the transmit/receive switch 62 to a preamplifier 64. Alternatively, the signals emitted by the excited nuclei may be sensed by separate receive coils such as parallel coils or surface coils 76. The amplified MR signals are demodulated, filtered and digitized in the receiver section of the transceiver 58. The transmit/receive switch 62 is controlled by a signal from the pulse generator module 38 to electrically connect the RF amplifier 60 to the RF coil 56 during the transmit mode and to connect the preamplifier 64 to the RF coil 56 during the receive mode. The transmit/receive switch 62 can also enable a separate RF coil (for example, a parallel or surface coil 76) to be used in either the transmit or receive mode.

The MR signals sensed by the RF coil 56 are digitized by the transceiver module 58 and transferred to a memory module 66 in the system control computer 32. MRI data is typically collected in a Fourier space known in imaging as "k-space", a reciprocal space connected to real space via a Fourier transform. Each MR signal is encoded with a particular spatial frequency using "phase-encoding" gradient pulses, and multiple such MR signals are digitized and stored in k-space for later reconstruction as an image. Typically, frames of data corresponding to MR signals are stored temporarily in the memory module 66 until they are subsequently transformed to create images. An array processor 68 uses a known transformation method, most commonly a Fourier transform, to create images from the MR signals. These images are communicated through the link 34 to the computer system 20 where it is stored in memory. In response to commands received from the operator console 12, this image data may be archived in long term storage or it may be further processed by the image processor 22 and conveyed to the operator console 12 and presented on display 16.

The MRI system described in FIG. 1 may be equipped with an array of RF receiver coil elements (i.e., "coil element"), in which each coil element separately detects the MRI signals. Such RF receiver coil arrays are well-known in the art and include whole body arrays as well as partial body arrays, such as head coil arrays, cardiac coil arrays, and spine coil arrays. Many arrays of coil elements are designed to be compatible with parallel imaging techniques, such that each coil element has a different spatial sensitivity profile from other coil elements in the array.

Figure 2:
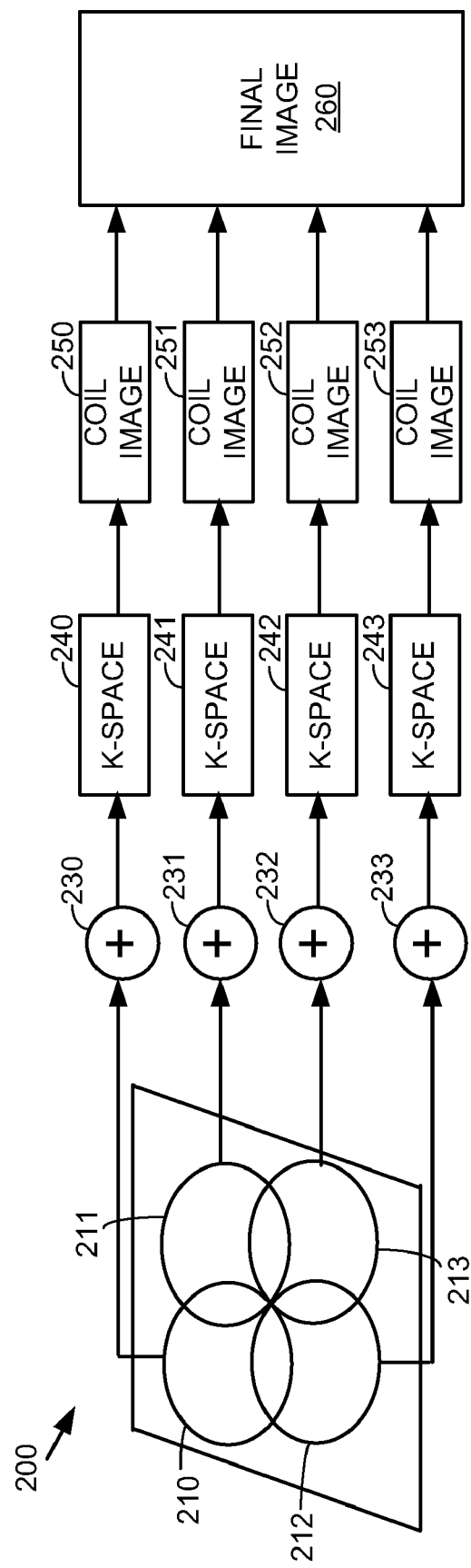
FIG. 2 is a schematic diagram of MRI data reception and processing from an exemplary array of coil elements in accordance with an embodiment.

FIG. 2 is a schematic diagram of MRI data reception and processing from an exemplary array of coil elements in accordance with an embodiment. An array of coil elements 200 is used to acquire MRI data for a field-of-view (FOV) in a subject and includes four separate coil elements 210, 211, 212 and 213. MRI signals from each coil element 210, 211, 212, 213 are transmitted separately to a corresponding data acquisition channel 230, 231, 232, 233, respectively. The MRI signals from each data acquisition channel are used to fill a corresponding (and separate) k-space 240, 241, 242, 243, respectively. A separate "coil image" 250, 251, 252, 253 is constructed from each k-space 240, 241, 242, 243, respectively. The separate coil images 250, 251, 252, 253 may then be combined using any one of the summation techniques known in the art, (e.g., sum of squares) into a final composite image 260.

Many RF receiver coil arrays are designed to be compatible with parallel imaging techniques in which k-space is under-sampled and the signals from multiple receiver coils are combined to provide aliasing-free images. For autocalibrated parallel imaging (API) techniques, a relationship between neighboring k-space data points (that arises from spatial sensitivity profiles of the individual coil elements) is determined in a fully sampled region of k-space and the relationship may be used to synthesize unacquired k-space data for under-sampled regions of k-space from the acquired k-space data. In particular, each k-space data point for a single coil element may be represented as a linear combination of its neighboring k-space data points from all coil elements and the same set of coefficients for the linear combination can be applied to all k-space locations to synthesize unacquired k-space data.

Figure 3:
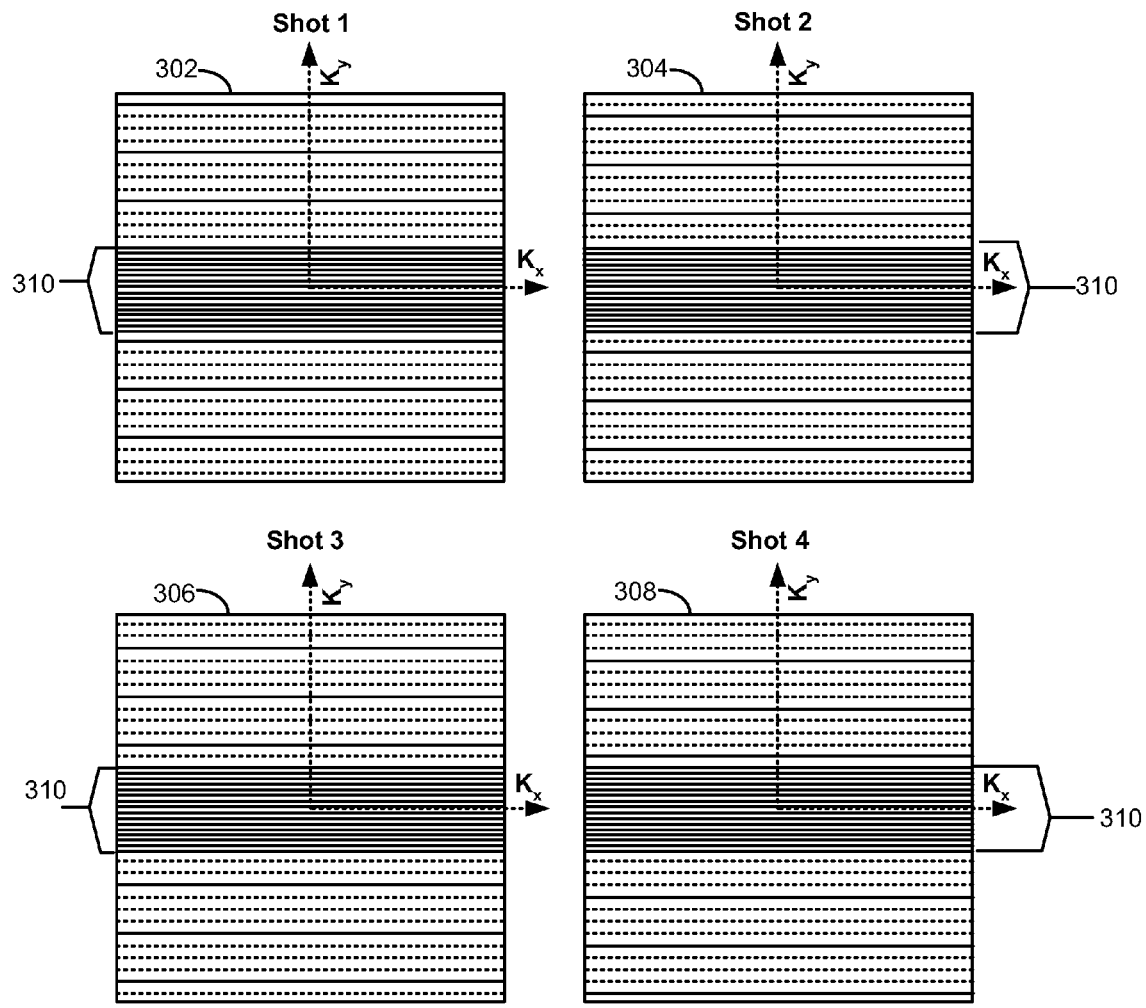
FIG. 3 is a schematic diagram showing an exemplary autocalibrated parallel imaging (API) sampling pattern for multiple shots in accordance with an embodiment.

FIG. 3 is a schematic diagram showing an exemplary API sampling pattern for multiple shots in accordance with an embodiment. FIG. 3 shows four two-dimensional (2D) k-spaces 302, 304, 306 and 308, each of which corresponds to one of the four individual shots of a four-shot acquisition. Each k-space ($k_x$, $k_y$) is composed of a 64×64 matrix of k-space elements in which the outer regions are under-sampled by a parallel imaging "reduction factor," R=2, and in which a central autocalibration region 310 is fully sampled. Acquired k-space data for each shot are shown as solid lines, whereas acquired k-space lines from other shots are shown as dashed lines. Unacquired k-space lines are not shown in FIG. 3. In the example of FIG. 3, every eighth k-space line is acquired for the outer regions of k-space. In the general case, each shot acquires every n×Rth k-space line in the outer region of k-space for a multi-shot acquisition with n shots. The k-space lines that are acquired in the outer regions of k-space for each shot are offset by R times the shot number, such that they may be later interleaved in a combined k-space, filling every Rth line with acquired k-space data. Although FIG. 3 shows a four-shot acquisition, any number of shots may be used for the multi-shot acquisition. The acquired k-space data in shots 302, 304, 306, 308 is incomplete and also contains phase and/or magnitude errors that vary from shot to shot. To create a desirable image, k-space data should be both complete and corrected.

After all the shots in a multi-shot acquisition have completed, the fully sampled regions of k-space (i.e., the autocalibration regions 310) from each of the shots are individually corrected and then averaged (or otherwise combined) to form a corrected reference autocalibration region for each coil element. Correction techniques known in the art may be applied to each autocalibration region 310 (i.e., a fully sampled region of k-space) because the Nyquist criterion is fulfilled in the autocalibration region. It is not necessary to use the data from all shots to create a corrected reference autocalibration region, however, it is desirable in order to increase the signal-to-noise ratio in this region. The k-space data in the corrected reference autocalibration region is both fully sampled and corrected.

Figure 4:
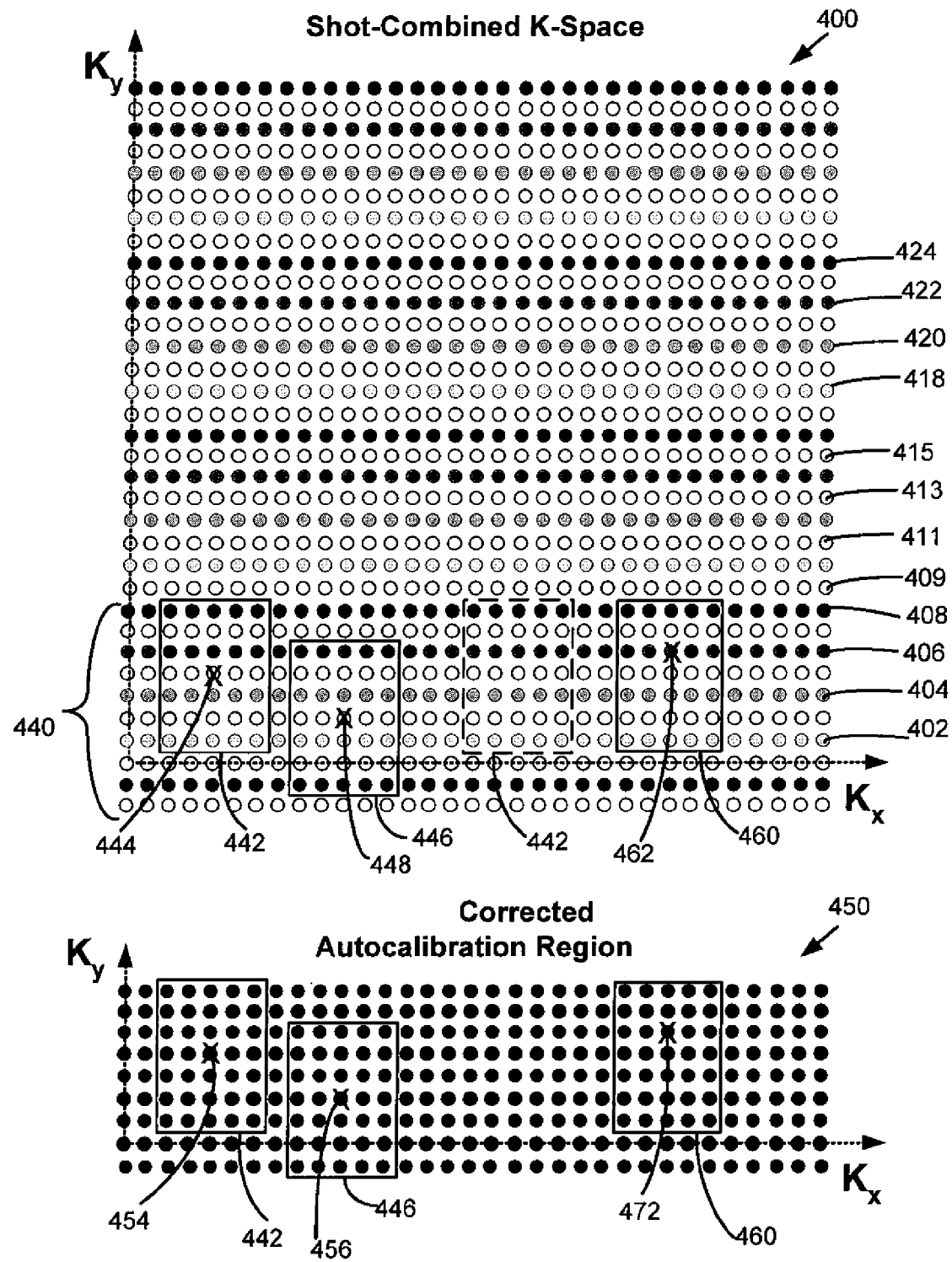
FIG. 4 is a schematic diagram showing an exemplary shot-combined k-space and an exemplary corrected reference autocalibration region for a single RF receiver coil element in accordance with an embodiment.

To determine the coefficients used to synthesize corrected k-space data, the k-space data from all shots in a multi-shot acquisition may be combined into a single k-space data set for each coil element. FIG. 4 is a schematic diagram showing an exemplary shot-combined k-space 400 and a corrected reference autocalibration region 450 for a single RF receiver coil element in accordance with an embodiment. In FIG. 4, one quadrant of a k-space is shown for a four-shot acquisition (for example, such as is shown in FIG. 3) with a parallel imaging reduction factor of R=2 in the outer under-sampled regions of k-space. Unacquired k-space data are shown as empty circles, for example, k-space data points 409, 411, 413, and 415. In the outer regions of k-space, data from each individual shot are interleaved by shot into every second k-space line (in the general case, into every Rth line). For example, a k-space line 418 is filled with data from Shot 1, a k-space line 420 is filled with data from Shot 2, a k-space line 422 is filled with data from Shot 3, and a k-space line 424 is filled with data from Shot 4. In an autocalibration region 440 of the shot-combined k-space 400, the same shot ordering is used as for the outer regions of k-space, such that a k-space line 402 is filled with data from Shot 1, a k-space line 404 is filled with data from Shot 2, a k-space line 406 is filled with data from Shot 3, and a k-space line 408 is filled with data from Shot 4.

As will be described further below, missing (or unacquired) k-space data points may be synthesized by a linear combination of acquired k-space data points from all coil elements that are local to the missing k-space data point. The set of coefficients used in this linear combination, described as a function of the k-space location of each acquired k-space data point relative to the location of the target missing k-space data point, are defined as a "kernel." All missing data points along the same line in k-space may be reconstructed by the same kernel. However, there are multiple geometric relationships between unacquired k-space lines to their neighboring acquired k-space lines, and each relationship will require a corresponding kernel. For a multi-shot acquisition, the geometric relationship of the unacquired k-space data to the acquired k-space data from individual shots must also be considered. Referring again to FIG. 4, the data for the k-space line corresponding to k-space data point 409 is synthesized using a different set of coefficients than is required for synthesizing the k-space data for the k-space line corresponding to k-space data point 411 because the nearest neighbor k-space lines for k-space data point 409 are from Shot 4 and Shot 1, whereas the nearest neighbor k-space lines for k-space data point 411 are from Shot 1 and Shot 2.

In a training phase, sets of coefficients are determined for each geometric relationship and each coil element separately. The multiple geometric relationships between target k-space data points and multiple associated neighboring source k-space data points (from all coil elements) are defined in order to synthesize all missing lines in k-space for a single coil element. A total of n×R sets of coefficients (where n is the number of shots and R is the reduction factor) must be determined to cover all geometric relationships for k-space data from individual shots. To determine the coefficients for each kernel, each target k-space data point is expressed as a linear combination of its associated neighboring source k-space data points from all the RF receiver coil elements. Multiple target k-space data points and their geometrically associated source k-space data points as defined by the kernel may be used to increase the determinacy of the fitting and thus the accuracy of the calculated coefficients in the presence of noise. Each combination of a target k-space data point plus its associated source k-space data points from all the RF receiver coil elements defined by the kernel constitutes a single "training data set." The training data sets each form a single linear equation in a system of such linear equations having the same coefficients.

All the k-space data shown in the shot-combined k-space 400 in FIG. 4 are uncorrected. In the training phase, source k-space data points from the shot-combined k-space 400 may be "trained" to the corrected reference autocalibration region 450. By training to the corrected reference autocalibration region 450, coefficients may be determined that can be used to synthesize corrected k-space data for the unacquired lines of k-space (e.g., the unacquired lines of k-space in the outer, undersampled regions f k-space). A rectangular window 442 shown in solid black lines defines a two-dimensional kernel containing an exemplary target k-space data point 444 (marked with "X"), its corresponding motion-corrected target k-space data point 454 in the corrected reference autocalibration region 450, and 20 acquired neighboring source k-space data points (5 source k-space data points from each shot). The corrected target k-space data point 454 together with the associated group of uncorrected source k-space data points from the shot-combined k-space 400 constitutes a single training data set, yielding a single linear equation and a set of coefficients. While the kernels shown in FIG. 4 are two-dimensional, it is alternatively possible to use a 1D kernel, in which the group of source k-space data points includes only source k-space data points that have the same $k_x$ value as the target k-space data point. Similarly, a 3D kernel may be used for data sets acquired in three spatial dimensions. Multiple training data sets may be derived by translating the window 442 to other appropriate target k-space data points in the fully sampled autocalibration region 440. For example, a second training data set that may be used to determine the same set of coefficients is shown defined by a second location for rectangular window 442 shown by dashed lines. A second kernel used to determine a different set of coefficients is shown defined by a rectangular window 446 shown in solid black lines and includes a target k-space data point 448. The second kernel 446 contains target k-space data point 448, its corresponding corrected k-space data point 456 in the corrected reference autocalibration region 450, and 20 acquired neighboring source k-space data points. Because the geometric relationship of target k-space data point 448 to neighboring acquired k-space data from the four shots is different than for target k-space data point 444, a different set of coefficients must be determined for kernel 446. Additional training data sets may be derived from the additional autocalibration data obtained by the other three shots (i.e., the data that was not originally included in the autocalibration region 440) by shifting the ky coordinate of the training data set, while still maintaining each shot's geometric relationship within the kernel. This is possible as long as the kernel of training data set resides completely within the autocalibration region 440. As mentioned above, the coefficients determined from the training data sets may be used to synthesize corrected k-space data for the unacquired lines of k-space in the outer, undersampled regions of k-space.

In order to fill the outer, undersampled regions of k-space completely with corrected k-space data, the k-space data in locations sampled by the acquisition (for example, the k-space lines corresponding to points 418, 420, 422 and 424) may be synthesized corrected k-space data. To synthesize the corrected k-space data, additional new kernels must be generated in order to compute appropriate coefficients. Referring again to FIG. 4, an example of such a kernel is shown outlined by a rectangular window 460 and includes a target k-space data point 462. A training data set for synthesizing corrected k-space data for the k-space line corresponding to data point 420 may be defined to consist of source k-space data points outlined by the rectangular window 460 in the shot-combined k-space 400 and a target k-space data point 472 in the corrected reference autocalibration region 450.

Data from the corrected reference autocalibration region 450 may be used to fill the center of k-space. This data may be scaled or apodized to reduce potential magnitude and/or phase differences between the two resulting regions. Alternatively, data in the autocalibration region may be re-synthesized as described for the undersampled regions. Both alternatives allow for the creation of a complete corrected data set for a single coil element.

The method described above may be repeated for each coil element until all k-space data from all coil elements has been corrected for phase and/or magnitude errors. The k-space data from all the coil elements may then be combined using methods known in the art to make a single image. FIG. 4 illustrates an exemplary embodiment in which k-space data from all shots are combined into a single k-space for convenience and for the purpose of illustration. It is, however, not necessary for the k-space data from the individual shots to be combined in a single k-space. Rather, the k-space data from the individual shots may be similarly corrected in their separate k-spaces, line-by-line, in a three-dimensional k-space with shot number as third dimension, or in any other convenient arrangement or organization of the k-space data that permits determination of the above-described kernels and synthesis of motion-corrected k-space data. In alternative arrangements of the k-space data, the corresponding kernels may be expressed as one-dimensional or three-dimensional matrices as appropriate.

Figure 5:
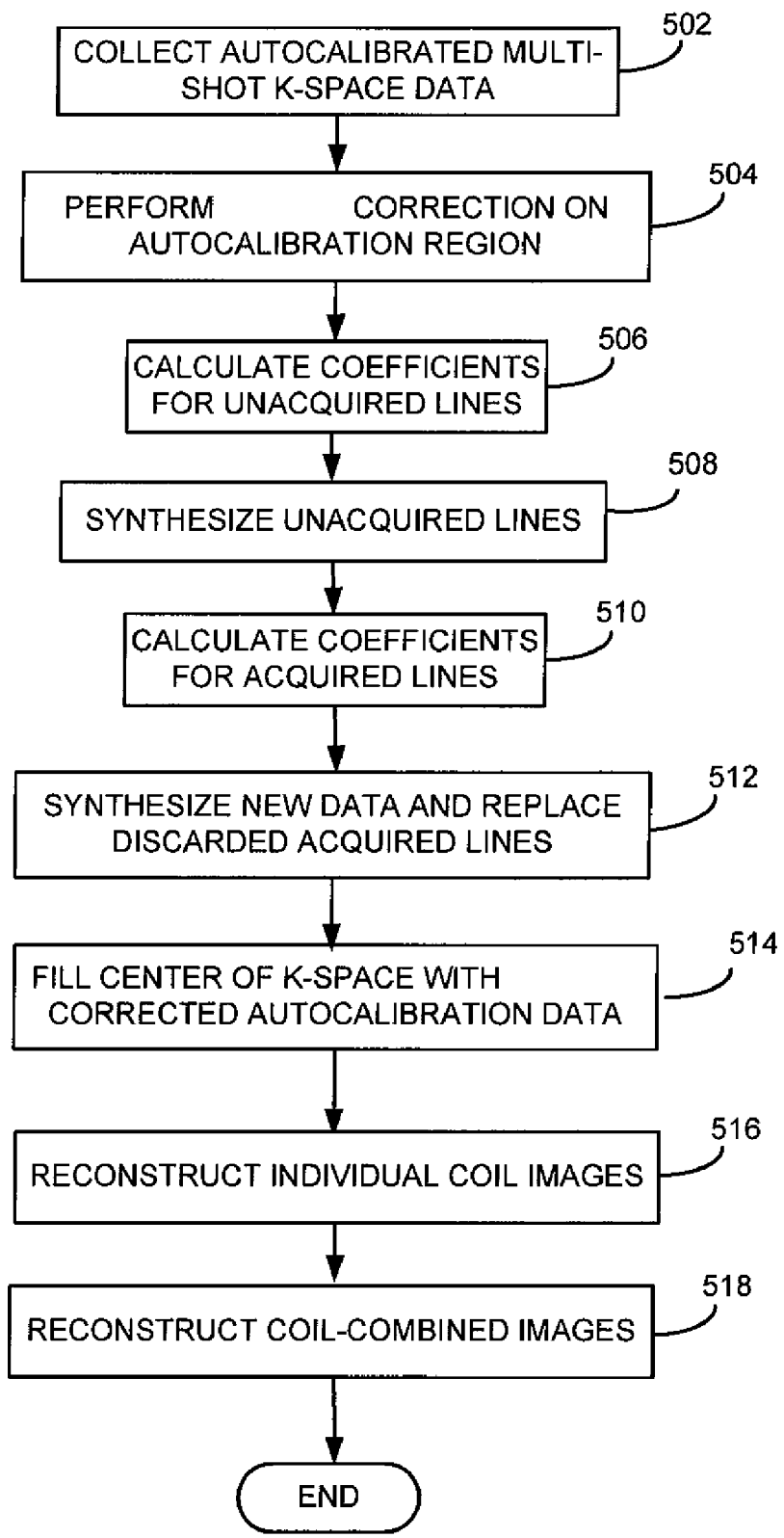
FIG. 5 is a flow chart showing an exemplary method for correcting phase and/or magnitude errors in a multi-shot autocalibrated acquisition in accordance with an embodiment.

FIG. 5 is a flow chart showing an exemplary method for correcting induced phase and/or magnitude errors in a multi-shot autocalibrated acquisition in accordance with an embodiment. At block 502, k-space data consistent with an autocalibrated parallel imaging multi-shot sequence are collected. The k-space data may be collected using, for example, a multi-shot EPI sequence with diffusion weighting, or alternatively, other multi-shot sequences such as Steady-State Free Precession (SSFP), Fast Spin Echo (FSE), or non-Carr-Purcell-Meiboom-Gill Fast Spin Echo (non-CPMG FSE) imaging may be used. Each shot fully samples an autocalibration region that contains enough fully sampled k-space data to allow determination of appropriate coefficients for synthesizing all k-space lines. At block 504, correction is performed using the k-space data from the autocalibration region. Known methods for correction may be used to perform correction on the k-space data in the autocalibration region. The end result at block 504 is a corrected reference autocalibration region containing corrected k-space data. At block 506, coefficients are calculated for the unacquired lines in k-space for each coil element. The coefficients are calculated using kernels to define source k-space data points from the original uncorrected k-space data from each coil element and k-space data points from the corrected reference autocalibration region are used for the target k-space data points. Accordingly, the coefficients are "trained" so that they may be used to synthesize corrected k-space data. At block 508, the coefficients calculated at block 506 are used to synthesize unacquired k-space lines in the outer, undersampled regions of k-space for each coil element. At block 510, a second set of kernels may be defined and used to calculated coefficients for the uncorrected acquired lines in the outer, undersampled regions of k-space for each coil element. The second set of kernels define source k-space data points from the original uncorrected k-space data from each coil element and target k-space data points from the corrected reference autocalibration region. At block 512, new corrected k-space data corresponding to the acquired lines are synthesized for each coil element using the coefficients that were calculated at block 510. At block 514, the corrected k-space data from the corrected reference autocalibration region are incorporated into the center of k-space for each coil element. At block 516, individual coil images are reconstructed from the corrected k-spaces. At block 518, the individual coil images may be combined using known methods (for example, using the "sum of squares" method) to reconstruct coil-combined images. Blocks 506-508, blocks 510-512, and blocks 516 may be accomplished in any relative order.

As mentioned above, the invention is capable of acquiring k-space data through a variety of known methods, including using Steady-state Free Precession (SSFP) sequences. SSFP sequences are known to have high signal to time efficiency, but they also suffer from "banding" artifacts in the presence of field inhomogeneity. One of the factors in the SSFP signal equation is a spin response function dependent on the spin frequency, which varies spatially with the background field. These spin response functions are periodic with frequency and exhibit periodic nulls in the magnitude response. Changing the RF phase increment effectively changes the reference center frequency of the sequence and shifts this response function with respect to frequency. In typical prior art methods, phase cycling methods have combined multiple images acquired with different RF phase increments and/or cycling schemes to produce a single artifact-free image. However, scan time in such methods is multiplied by the total number of acquired base images, thereby negating most of the advantages gained in producing such an artifact-free image.

However, because these response functions are slowly varying in space, they can be characterized with low resolution images. According to embodiments of the invention, the RF phase increment is capable of being changed with each shot, which is fully-sampled near the center of k-space but undersampled in the outer regions. This undersampling of the outer regions of k-space reduces the total number of k-space lines to be acquired when compared to conventional phase cycling methods. The low resolution autocalibration images are then used to produce a low resolution reference image with known phase cycling methods. This low resolution reference image is transformed into target k-space data used for training using the technique set forth above so as to generate coefficients for k-space data synthesis. Synthesis and correction of the outer k-space regions produces a full k-space data set, which is then capable of being transformed into an image that is free of aliasing and banding artifacts. In this way, the technique set forth above may be applied to SSFP sequences to produce high-quality reconstructed images.

Further, just as embodiments of the invention are capable of being applied to SSFP sequences, they can also be applied to non-Carr-Purcell-Meiboom-Gill Fast Spin Echo (non-CPMG FSE) imaging. Non-CPMG is a variant of FSE that modulates the phase of the refocusing pulses to sustain the echo train even when spins do not comply with MG conditions at the start of the echo train. Non-CPMG is typically used for diffusion weighted imaging where the phase of the spins are unpredictable after applying diffusion weighted gradients. One disadvantage of using Non-CPMG FSE imaging is that the spins alternate between two states as the echo train progresses such that two images are reconstructed from a single echo train. By reconstructing two images from a single echo train, the echo train length is effectively doubled, and hence the acquisition time is effectively doubled. The two states of the spins differ in phase, which in turn depends on the phase of the spins at the start of the echo train. However, since the phase variation from diffusion weighting gradients is generally slowly varying in space, the relationship between the two states can also be characterized with low resolution images.

Using the technique as described above, it is possible for two or more shots to be used to entirely fill in k-space data by using data from the two states. Again, the central region of k-space is fully sampled, while the outer regions is undersampled with interleaving of the two states, thereby reducing the total number of lines acquired for each echo train. Low resolution autocalibration images are used to produce a low resolution reference image with fixed phase. This low resolution reference image is transformed into target k-space data used for training to generate coefficients for synthesis of unacquired k-space data. Synthesis and correction of the outer k-space regions produces a full k-space data set, which is then capable of being transformed into an image that is free of artifacts.

In an alternative embodiment, an outer fraction of k-space of up to approximately forty percent of the entire k-space may be unacquired. After application of the above described method, a homodyne reconstruction may be applied to reconstruct images.

In another embodiment, the acquisition may repeat one or more shots that acquire along the same locations in k-space. Each iteration of a shot is called an "excitation." The data for each excitation may be corrected separately or data from multiple excitations may be classified as additional shots and corrected together.

In another alternative embodiment, three-dimensional k-space data that encodes three spatial dimensions may be acquired. The autocalibration region and kernels may have three spatial dimensions. The above-described method may then be extended to correct a three-dimensional data set.

In another embodiment, the autocalibration region may be undersampled and then fully reconstructed using, for example, data from a separate acquisition. The above-described method may utilize these reconstructed autocalibration regions for correction and reconstruction of the other undersampled region or regions.

In another alternative embodiment, acquisition may be performed with only one coil element. Data from all shots together may cover all data in the k-space matrix such that no locations in k-space are undersampled. In this case, the number of geometric relationships is equal to the number of shots and each line may be corrected with the above-described method.

In another embodiment, a full set of k-space data may be produced for each coil and shot combination. For each coil-shot, an uncorrected autocalibration region serves as the reference autocalibration region. Data from all other coil-shots are trained to this uncorrected autocalibration region and used to synthesize only the unacquired data for that coil-shot. This is repeated for each coil-shot. The full sets of k-space data from all coil-shots may then be combined to produce artifact-free images with methods known in the art.

In another embodiment, only one set of k-space data is produced, instead of a set of k-space data for each shot. A single reference autocalibration region is produced by combining fully sampled autocalibration regions from all shots and all coils using methods known in the art for coil combination as well as phase correction. Data from all coils and shots are trained to this single reference autocalibration region, and are used to generate a single set of corrected, coil-combined k-space data.

Computer-executable instructions for performing correction according to the above-described method may be stored on a form of computer readable media. Computer readable media includes volatile and nonvolatile, removable and non-removable media implemented in any method or technology for storage of information such as computer readable instructions, data structures, program modules or other data. Computer readable media includes, but is not limited to, random access memory (RAM), read-only memory (ROM), electrically erasable programmable ROM (EEPROM), flash memory or other memory technology, compact disk ROM (CD-ROM), digital versatile disks (DVD) or other optical storage, magnetic cassettes, magnetic tape, magnetic disk storage or other magnetic storage devices, or any other medium which can be used to store the desired instructions and which may be accessed by MRI system 10 (shown in FIG. 1), including by internet or other computer network forms of access.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims. The order and sequence of any process or method steps may be varied or re-sequenced according to alternative embodiments.

Many other changes and modifications may be made to the present invention without departing from the spirit thereof. The scope of these and other changes will become apparent from the appended claims.

What is claimed is:

1. A method for correcting phase and/or magnitude errors in multiple shot magnetic resonance imaging (MRI) data acquisition, the method comprising:
    acquiring uncorrected k-space data comprising an autocalibration region and at least one undersampled outer region;
    generating corrected k-space data corresponding to the autocalibration region;
    generating a corrected reference autocalibration region using at least a portion of the corrected k-space data;
    calculating at least one set of coefficients based on a plurality of data points from the uncorrected k-space data and at least one data point from the corrected reference autocalibration region; and
    synthesizing corrected k-space data using the at least one set of coefficients.

2. A method according to claim 1, wherein synthesizing corrected k-space data using the at least one set of coefficients comprises synthesizing corrected k-space data corresponding to the at least one undersampled region.

3. A method according to claim 1, further comprising reconstructing an image for at least one coil element by combining the corrected k-space data corresponding to the autocalibration region and the synthesized corrected k-space data, wherein the autocalibration region is located near a center of k-space.

4. A method according to claim 1, wherein the autocalibration region is fully sampled.

5. A method according to claim 1, wherein the autocalibration region is undersampled.

6. A method according to claim 1, wherein generating a corrected reference autocalibration region comprises calculating a corrected combination of the uncorrected k-space data within the autocalibration region of at least one shot from the plurality of shots and one coil from the plurality of coils.

7. A method according to claim 1, wherein generating a corrected reference autocalibration region comprises copying uncorrected k-space data from the autocalibration region of at least one shot from the plurality of shots and at least one coil from the plurality of coils.

8. A method according to claim 1, wherein the magnetic resonance imaging (MRI) data acquisition comprises a steady-state free precession (SSFP) sequence.

9. A method according to claim 1, wherein calculating at least one set of coefficients comprises fitting a target k-space data point to a linear combination of neighboring source k-space data points from at least one coil element and at least one shot.

10. A method according to claim 9, wherein the target k-space data point is selected from the corrected reference autocalibration region and the neighboring source k-space data points are selected from the uncorrected k-space data.

11. A computer-readable medium having computer-executable instructions for performing a method for correcting phase and/or magnitude errors in a multiple shot magnetic resonance imaging (MRI) data acquisition, the computer-readable medium comprising:
    program code for acquiring MRI data using a plurality of shots, each shot acquiring uncorrected k-space data comprising an autocalibration region and at least one undersampled outer region;
    program code for generating corrected k-space data corresponding to the autocalibration region of each shot;
    program code for generating a corrected reference autocalibration region using at least a portion of the corrected k-space data;
    program code for calculating at least one set of coefficients based on a plurality of data points from the uncorrected k-space data and at least one data point from the corrected reference autocalibration region; and
    program code for synthesizing corrected k-space data by using the at least one set of coefficients.

12. A computer readable medium according to claim 11, wherein the program code for synthesizing corrected k-space data using the at least one set of coefficients comprises program code for synthesizing corrected k-space data corresponding to the at least one undersampled region.

13. A computer readable medium according to claim 11, further comprising program code for reconstructing an image for at least one coil element and at least one shot by combining the corrected k-space data corresponding to the autocalibration region and the synthesized corrected k-space data.

14. A computer readable medium according to claim 11, wherein the program code for generating a corrected reference autocalibration region comprises program code for calculating a corrected combination of uncorrected k-space data within the autocalibration region of at least one shot from the plurality of shots and at least one coil from the plurality of coils.

15. A computer readable medium according to claim 11, wherein the program code for generating the corrected reference autocalibration region comprises program code for copying uncorrected k-space data from the autocalibration region of at least one shot from the plurality of shots and at least one coil from the plurality of coils.

16. A computer readable medium according to claim 11, wherein the program code for calculating at least one set of coefficients comprises program code for fitting a target k-space data point to a linear combination of neighboring source k-space data points from at least one coil element and at least one shot.

17. A computer readable medium according to claim 16, wherein the target k-space data point is selected from the corrected reference autocalibration region and the neighboring source k-space data points are selected from the uncorrected k-space data.

18. An apparatus for generating a magnetic resonance image, the apparatus comprising:
- a magnetic resonance imaging assembly comprising a magnet, a plurality of gradient coils, an array of radio frequency (RF) receiver coil elements, a radio frequency transceiver system and a pulse generator module; and
- a computer system coupled to the magnetic resonance imaging assembly, wherein the computer system is programmed to:
- acquire MRI data using a plurality of shots, each shot acquiring uncorrected k-space data comprising an autocalibration region and at least one undersampled outer region;
- generate corrected k-space data corresponding to the autocalibration region of each shot;
- generate a corrected reference autocalibration region using at least a portion of the corrected k-space data;
- calculate at least one set of coefficients based on a plurality of data points from the uncorrected k-space data and at least one data point from the corrected reference autocalibration region; and
- synthesize corrected k-space data using the at least one set of coefficients.

19. An apparatus according to claim 18, wherein the computer system is further programmed to calculate the at least one set of coefficients by fitting a target k-space data point to a linear combination of neighboring source k-space data points from at least one coil element.

20. An apparatus according to claim 19, wherein the target k-space data point is selected from the corrected reference autocalibration region and the neighboring source k-space data points are selected from the uncorrected k-space data.

* * * * *